(12) United States Patent  (10) Patent No.: US 7,799,238 B2
Shindo et al.  (45) Date of Patent: Sep. 21, 2010

(54) PLASMA PROCESSING METHOD AND PLASMA PROCESSING APPARATUS

(75) Inventors: Toshihiko Shindo, Nirasaki (JP); Shin Okamoto, Nirasaki (JP); Kimihiro Higuchi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/433,112

(22) Filed: Apr. 30, 2009

(65) Prior Publication Data

US 2009/0212017 A1    Aug. 27, 2009

Related U.S. Application Data

(60) Division of application No. 11/066,260, filed on Feb. 28, 2005, now Pat. No. 7,541,283, which is a continuation of application No. PCT/JP03/010937, filed on Aug. 28, 2003.

(30) Foreign Application Priority Data

Aug. 30, 2002  (JP)  ............................. 2002-256096

(51) Int. Cl.
  *B44C 1/22* (2006.01)
  *C23F 1/08* (2006.01)
(52) U.S. Cl. .................................. 216/67; 156/345.43
(58) Field of Classification Search .................. None
  See application file for complete search history.

(56) References Cited

U.S. PATENT DOCUMENTS

| | | | |
|---|---|---|---|
| 5,310,453 A | 5/1994 | Fukasawa et al. ........... 438/716 |
| 5,459,632 A | 10/1995 | Birang et al. ............... 361/234 |
| 5,494,522 A | 2/1996 | Moriya et al. ............... 118/719 |
| 5,699,223 A | 12/1997 | Mashiro et al. ............. 361/234 |
| 5,779,926 A | 7/1998 | Ma et al. |
| 5,818,682 A | 10/1998 | Loo ........................... 361/234 |
| 5,894,400 A | 4/1999 | Graven et al. ............... 361/234 |
| 5,946,184 A | 8/1999 | Kanno et al. ................ 361/234 |
| 5,997,687 A | 12/1999 | Koshimizu ............. 156/345.44 |
| 6,083,361 A | 7/2000 | Kobayashi et al. ..... 204/192.15 |
| 6,217,658 B1 * | 4/2001 | Orczyk et al. ............... 118/697 |
| 6,238,160 B1 | 5/2001 | Hwang et al. ............... 414/217 |
| 6,243,251 B1 | 6/2001 | Kanno et al. ................ 361/234 |
| 6,373,681 B2 | 4/2002 | Kanno et al. ................ 361/234 |
| 6,416,822 B1 | 7/2002 | Chiang et al. ............... 427/561 |

(Continued)

FOREIGN PATENT DOCUMENTS

JP  6-318552  11/1994

(Continued)

*Primary Examiner*—Allan Olsen
(74) *Attorney, Agent, or Firm*—Oblon, Spivak, McClelland, Maier & Neustadt, L.L.P

(57) ABSTRACT

A plasma processing method for performing a plasma process on a substrate to be processed by making a plasma act thereon includes the following sequential steps of making a plasma weaker than one used in the plasma process act on the substrate, applying a DC voltage to an electrostatic chuck for attracting and holding the substrate while the weak plasma acts on the substrate, extinguishing the weak plasma, and performing the plasma process. Further, a plasma processing apparatus includes a plasma processing mechanism for performing a plasma process on a substrate to be processed, and a controller for controlling the plasma processing mechanism to thereby perform the plasma processing method.

5 Claims, 11 Drawing Sheets

U.S. PATENT DOCUMENTS

| | | |
|---|---|---|
| 6,428,859 B1 | 8/2002 | Chiang et al. ............... 427/457 |
| 6,452,775 B1 | 9/2002 | Nakajima .................... 361/234 |
| 6,468,384 B1 | 10/2002 | Singh et al. ............. 156/345.27 |
| 6,569,501 B2 | 5/2003 | Chiang et al. ............... 427/535 |
| 6,630,201 B2 | 10/2003 | Chiang et al. .......... 427/255.28 |
| 6,800,173 B2 | 10/2004 | Chiang et al. .......... 156/345.33 |
| 6,878,233 B2 | 4/2005 | Hirose ................... 156/345.28 |
| 7,189,432 B2 | 3/2007 | Chiang et al. .......... 427/255.23 |
| 7,218,503 B2 | 5/2007 | Howald ...................... 361/234 |
| 7,265,963 B2 | 9/2007 | Hirose ........................ 361/234 |
| 7,326,358 B2* | 2/2008 | Sugimoto .................... 216/67 |
| 2002/0073924 A1 | 6/2002 | Chiang et al. ............ 118/723 R |
| 2002/0076481 A1 | 6/2002 | Chiang et al. .................... 427/8 |
| 2002/0076490 A1 | 6/2002 | Chiang et al. ............... 427/248.1 |
| 2002/0076507 A1 | 6/2002 | Chiang et al. ............... 427/569 |
| 2002/0076508 A1 | 6/2002 | Chiang et al. ............... 427/569 |
| 2002/0104481 A1 | 8/2002 | Chiang et al. ........ 118/723.001 |
| 2002/0144655 A1 | 10/2002 | Chiang et al. ............... 118/715 |
| 2002/0144657 A1 | 10/2002 | Chiang et al. ............ 118/723 E |
| 2002/0144786 A1 | 10/2002 | Chiang et al. .......... 156/345.51 |
| 2002/0146511 A1 | 10/2002 | Chiang et al. ........... 427/248.1 |
| 2002/0164421 A1 | 11/2002 | Chiang et al. ........... 427/248.1 |
| 2002/0164423 A1 | 11/2002 | Chiang et al. .......... 427/255.28 |
| 2002/0197402 A1 | 12/2002 | Chiang et al. .......... 427/255.39 |
| 2003/0087520 A1 | 5/2003 | Chen et al. |
| 2003/0151372 A1* | 8/2003 | Tsuchiya et al. ........ 315/111.81 |
| 2004/0031699 A1* | 2/2004 | Shoji ....................... 205/791.5 |
| 2004/0212312 A1 | 10/2004 | Chistyakov ............. 315/111.21 |
| 2005/0016471 A1 | 1/2005 | Chiang et al. ................ 118/728 |
| 2005/0051100 A1 | 3/2005 | Chiang et al. ................ 118/728 |
| 2005/0142873 A1 | 6/2005 | Shindo et al. ............... 438/680 |
| 2005/0167263 A1 | 8/2005 | Chistyakov ............ 204/192.12 |
| 2005/0184669 A1 | 8/2005 | Chistyakov ............ 315/111.21 |
| 2005/0191830 A1 | 9/2005 | Collins et al. ............... 438/514 |
| 2005/0225923 A1 | 10/2005 | Howald ...................... 361/234 |
| 2005/0230047 A1 | 10/2005 | Collins et al. .......... 156/345.33 |
| 2006/0046506 A1 | 3/2006 | Fukiage ..................... 438/758 |
| 2006/0175197 A1 | 8/2006 | Chistyakov ............... 204/298.2 |
| 2007/0065594 A1 | 3/2007 | Chiang et al. ............... 427/533 |
| 2007/0188104 A1 | 8/2007 | Chistyakov et al. .... 315/111.21 |
| 2008/0105378 A1* | 5/2008 | Sugimoto ............. 156/345.24 |
| 2008/0242086 A1* | 10/2008 | Matsumaru et al. ......... 438/680 |

FOREIGN PATENT DOCUMENTS

| | | |
|---|---|---|
| JP | 10-27780 | 1/1998 |
| JP | 10-199965 | 7/1998 |
| JP | 2001-284442 | 10/2001 |
| TW | 316324 | 10/1985 |
| TW | 521379 | 10/1990 |

\* cited by examiner

FIG. 7
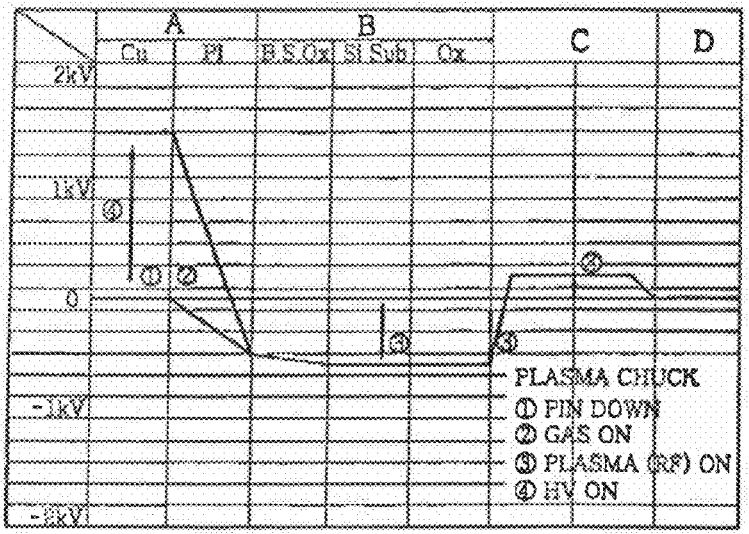
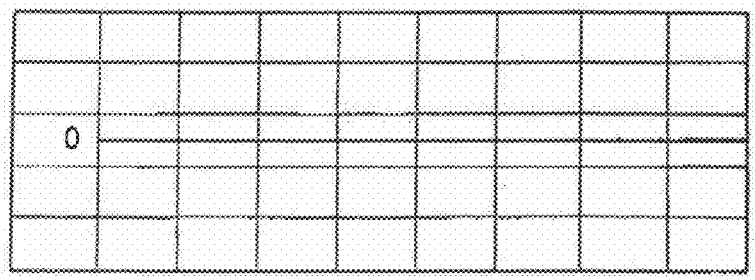
① PIN DOWN
② GAS ON
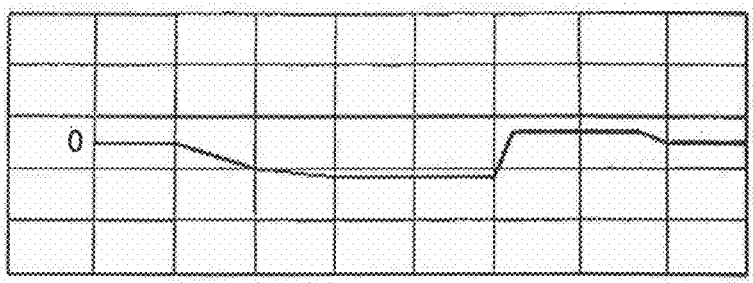
③ PLASMA (RF) ON
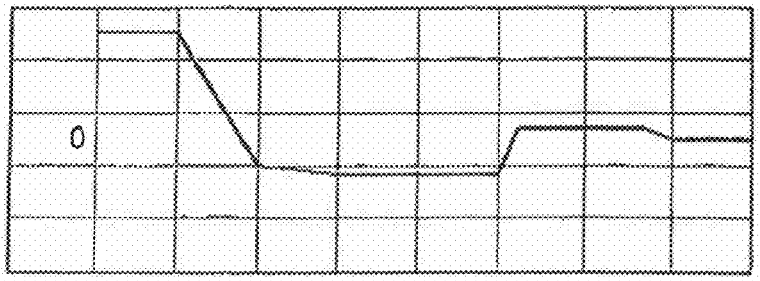
④ HV ON FIG.8
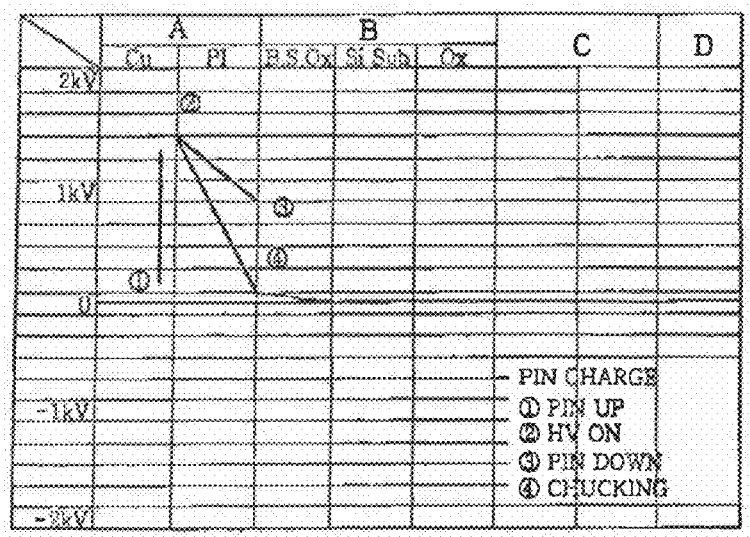
① PIN UP
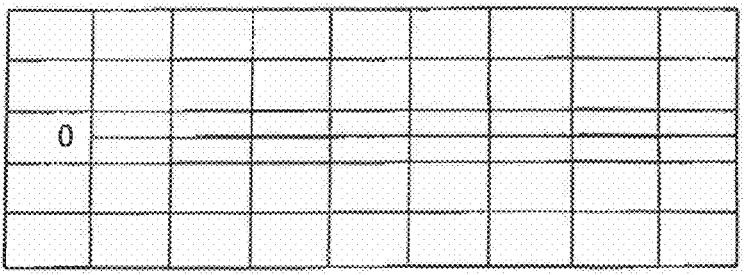
② HV ON
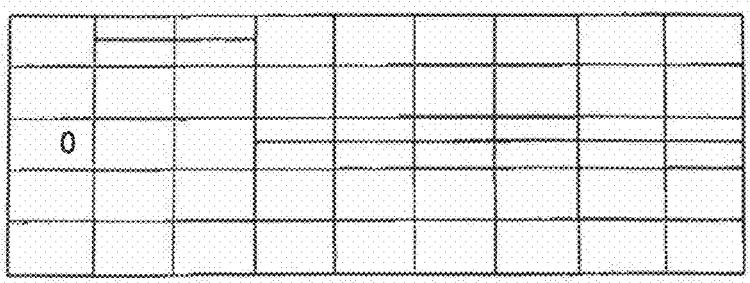
③ PIN DOWN
④ CHUCKING
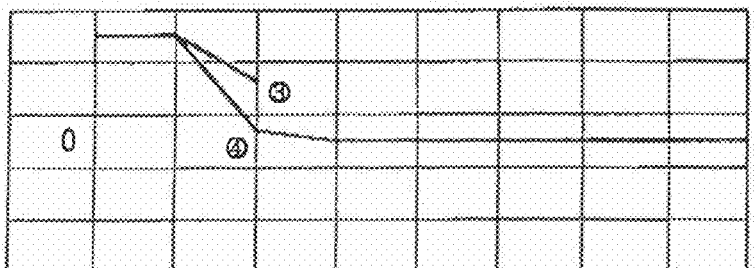

FIG.11

| VOLTAGE VALUE / PARTICLE DIAMETER | 0V | 1.5kV | 2.0kV | 2.5kV |
|---|---|---|---|---|
| 0.16–0.20 | 8 | 43 | 89 | 276 |
| 0.20–1.00 | 5 | 31 | 114 | 132 |
| 1.00– | 23 | 8 | 48 | 56 |
| TOTAL | 36 | 82 | 221 | 464 |

FIG.12

| PARTICLE DIAMETER | HV ON → RF ON → RF OFF → HV OFF | RF ON → HV ON → HV OFF → RF OFF |
|---|---|---|
| 0.16-0.20 | 429.3 | 2 |
| 0.20-1.00 | 607 | 4.5 |
| 1.00- | 119.3 | 4 |
| TOTAL | 1155.7 | 10.5 |

… 
PLASMA PROCESSING METHOD AND PLASMA PROCESSING APPARATUS

This application is divisional application of U.S. application Ser. No. 11/066,260, filed on Feb. 28, 2005, which is a Continuation Application claiming priority to PCT International Application No. PCT/JP03/10937 filed on Aug. 28, 2003.

FIELD OF THE INVENTION

The present invention relates to a plasma processing method and a plasma processing apparatus; and, more particularly, to a plasma processing method and a plasma processing apparatus for performing a plasma etching process and the like on a substrate to be processed such as a semiconductor wafer and an LCD substrate.

BACKGROUND OF THE INVENTION

Conventionally, a plasma etching method for performing a process on a substrate to be processed such as a semiconductor wafer and an LCD substrate by using a plasma is widely employed. For example, in a manufacturing process of a semiconductor device, a plasma etching process for plasma etching a thin film and the like formed on a semiconductor wafer to thereby remove them is widely used in order to form a fine electric circuit on a substrate to be processed, e.g., a semiconductor wafer.

In an etching apparatus for performing such a plasma etching process, a plasma is generated in a processing chamber (an etching chamber) configured to be airtightly sealed. Further, a semiconductor wafer is mounted on a susceptor disposed in the etching chamber and an etching is carried out thereon.

Further, there are various types of units for generating such a plasma. For instance, in an apparatus for generating a plasma by supplying a high frequency power to a pair of parallel plate electrodes disposed in parallel to face each other vertically, one of the parallel plate electrodes, e.g., a lower electrode, serves as a susceptor. Further, a semiconductor wafer is disposed on the lower electrode and a high frequency voltage is applied between the parallel plate electrodes, whereby a plasma is generated and an etching is carried out.

However, in such an etching apparatus, there may occur a so-called surface arcing that causes a thunder-like abnormal discharge on a surface of a semiconductor wafer during an etching.

The surface arcing possibly occurs, for example, when an insulating layer formed on a conductive layer is etched. For example, in case when an insulating layer formed of a silicon oxide film is etched to form a contact hole leading to a lower conductive layer formed of, e.g., a metal layer, the silicon oxide film whose thickness is reduced by etching may be destroyed due to the surface arcing.

Further, when the surface arcing occurs, a large portion of the silicon oxide film of the semiconductor wafer is destroyed, so that most devices of the semiconductor wafer will become faulty. Furthermore, metal becomes contaminated in the etching chamber, whereby the etching process cannot be continued under such a condition and it is necessary to clean the inside of the etching chamber. Accordingly, the productivity gets significantly lowered.

SUMMARY OF THE INVENTION

It is, therefore, an object of the present invention to provide a plasma processing method and a plasma processing apparatus for preventing a surface arcing from occurring on a substrate to be processed to thereby improve productivity compared to conventional ones.

In accordance with the present invention, there is provided a plasma processing method for performing a plasma process on a substrate to be processed by making a plasma act thereon, the method including the following sequential steps of: making a plasma weaker than one used in the plasma process act on the substrate; applying a DC voltage to an electrostatic chuck for attracting and holding the substrate while the weak plasma acts on the substrate; extinguishing the weak plasma; and performing the plasma process.

Further, in accordance with the present invention, there is provided a plasma processing method for performing a plasma process on a substrate to be processed by making a plasma act thereon, the method including the following sequential steps of: performing the plasma process on the substrate; making a plasma weaker than one used in the plasma process act on the substrate; applying an opposite DC voltage to an applied DC voltage to an electrostatic chuck for attracting and holding the substrate while the weak plasma acts on the substrate; stopping applying the opposite DC voltage; and extinguishing the weak plasma.

Furthermore, in accordance with the present invention, there is provided a plasma processing method for performing a plasma process on a substrate to be processed by making a plasma act thereon, the method including the following sequential steps of: applying a high frequency power of a first power level to a lower electrode for mounting thereon the substrate; applying a high frequency power of a second power level to an upper electrode disposed to face the lower electrode; applying a DC voltage to an electrostatic chuck for attracting and holding the substrate; applying a high frequency power of a larger power level than the first power level to the lower electrode; and performing the plasma process on the substrate by applying a high frequency power of a larger power level than the second power level to the upper electrode.

Moreover, in accordance with the present invention, there is provided a plasma processing method for performing a plasma process on a substrate to be processed by making a plasma act thereon, the method including the following sequential steps of: applying a high frequency power of a first power level to a lower electrode for mounting thereon the substrate; applying a DC voltage to an electrostatic chuck for attracting and holding the substrate; stopping applying the high frequency power of the first power level to the lower electrode; and performing the plasma process on the substrate by applying a high frequency power of a larger power level than the first power level to the lower electrode.

Additionally, in accordance with the present invention, there is provided a plasma processing method for performing a plasma process on a substrate to be processed by making a plasma act thereon, the method including the following sequential steps of: performing the plasma process on the substrate; applying a high frequency power of a third power level to a lower electrode for mounting thereon the substrate; applying an opposite DC voltage to an applied DC voltage to an electrostatic chuck for attracting and holding the substrate; stopping applying the opposite DC voltage; and stopping applying the high frequency power of the third power level to the lower electrode.

BRIEF DESCRIPTION OF THE DRAWINGS

The above and other objects and features of the present invention will become apparent from the following description of preferred embodiments, given in conjunction with the accompanying drawings, in which:

FIG. 7 depicts a diagram for explaining potential variation of each portion in the chucking method shown in FIG. 6;

FIG. 8 represents a diagram for explaining potential variation of each portion in another chucking method;

FIG. 11 describes a relation between a voltage applied to the electrostatic chuck and the number of particles; and FIG. 12 offers the number of particles according to a sequence.

DETAILED DESCRIPTION OF THE PREFERRED EMBODIMENTS

Hereinafter, preferred embodiments of the present invention will be described in detail with reference to the accompanying drawings.

Figure 1:
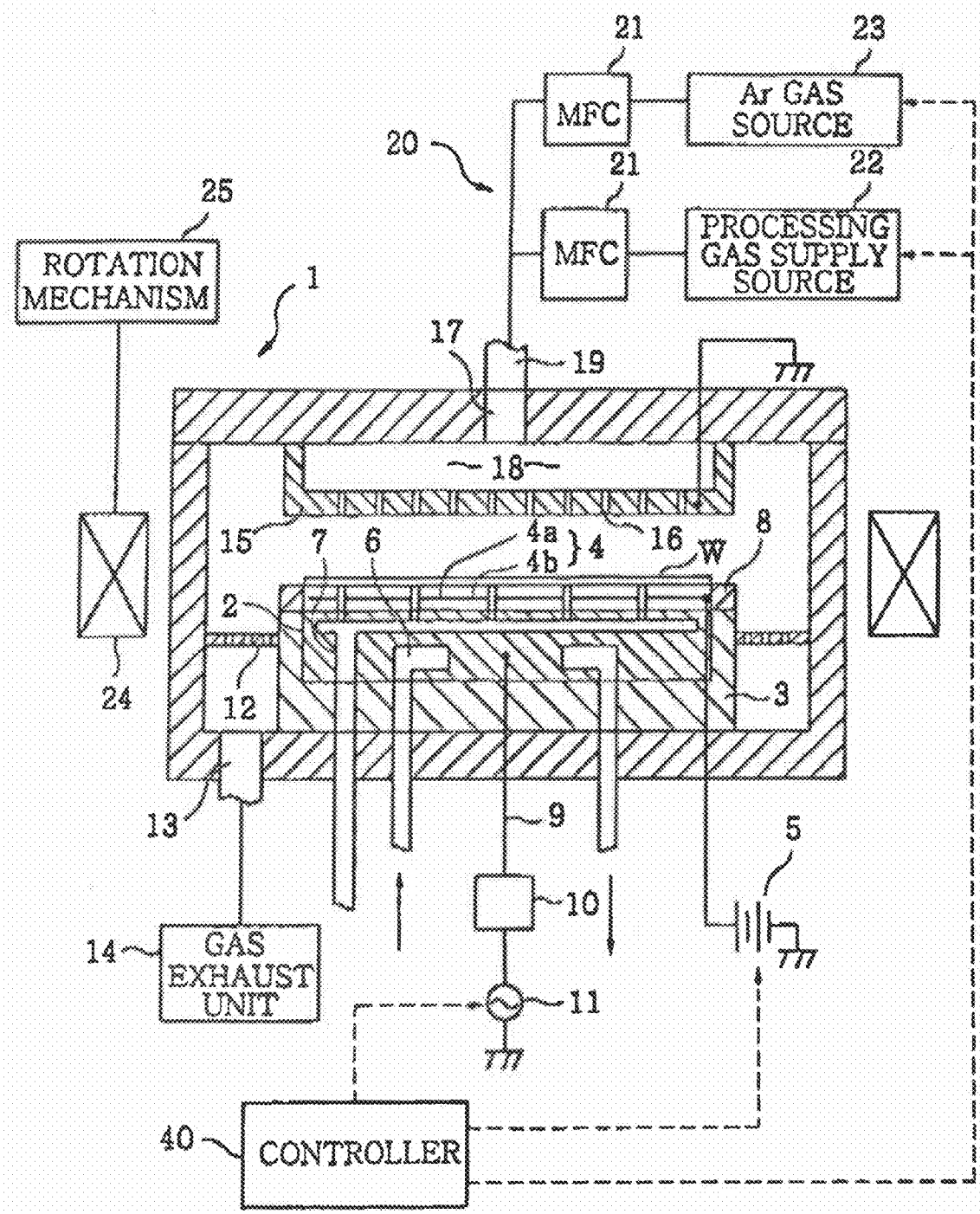
FIG. 1 shows a schematic configuration of an apparatus for use in an embodiment of the present invention.

FIG. 1 shows a schematic configuration of a whole plasma processing apparatus (an etching apparatus) for use in an embodiment of the present invention. A cylindrical vacuum chamber 1 illustrated in FIG. 1 is a processing chamber made of, for example, aluminum and airtightly sealed.

The vacuum chamber 1 is electrically grounded. Further, installed inside the vacuum chamber 1 is a mounting table 2 also serving as a lower electrode, which is made of a conductive material, e.g., aluminum, and is of a shape of a block.

The mounting table 2 is supported by an insulating plate 3 made of ceramic and the like in the vacuum chamber 1. An electrostatic chuck 4 is disposed on a mounting surface of the mounting table 2 for the semiconductor wafer W. The electrostatic chuck 4 includes an insulating film 4b made of an insulating material and an electrostatic chuck electrode 4a embedded in the insulating film 4b, and the electrostatic chuck electrode 4a is connected to a DC power supply 5. The electrostatic chuck electrode 4a and the insulating film 4b are, respectively, made of copper and polyimide, for example.

Further, installed within the mounting table 2 are a heat transfer medium path 6 for circulating an insulating fluid serving as a heat transfer medium for a temperature control and a gas channel 7 for supplying a gas for a temperature control such as He gas to a backside surface of the semiconductor wafer W.

Further, the mounting table 2 can be controlled to be maintained at a specified temperature by circulating an insulating fluid controlled to be kept at a specified temperature in the heat transfer medium path 6, and a gas for temperature control is supplied between the mounting table 2 and the backside surface of the semiconductor wafer W via the gas channel 7, whereby heat exchange therebetween can be facilitated and the semiconductor wafer W can be efficiently controlled to be maintained at a predetermined temperature with a good accuracy.

Furthermore, a focus ring 8 formed of a conductive material or an insulating material is disposed at an upper peripheral portion of the mounting table 2, and a feeder line 9 for supplying a high frequency power is connected to approximately the center of the mounting table 2. A high frequency power supply (RF power supply) 11 is connected to the feeder line 9 via a matching unit 10, and a high frequency power of a specified frequency is supplied from the high frequency power supply 11.

Further, an annular gas exhaust ring 12 having a plurality of exhaust holes is installed outside the focus ring 8, and a processing space inside the vacuum chamber 1 is exhausted to vacuum by an exhaust pump and the like of a gas exhaust unit 14 connected to a gas exhaust port 13 via the gas exhaust ring 12.

Meanwhile, at the ceiling portion of the vacuum chamber 1 above the mounting table 2, a shower head 15 is installed such that it faces in parallel the mounting table 2 and the shower head 15 is grounded. Thus, it is designed such that the shower head 15 and the mounting table 2 function as a pair of electrodes (an upper electrode and a lower electrode).

A plurality of gas discharge openings 16 are formed on the backside surface of the shower head 15, and a gas inlet 17 is disposed at an upper portion thereof. Also, a gas diffusion space 18 is formed inside the shower head 15. The gas inlet 17 is connected to a gas supply line 19, and a gas supply system 20 is connected to the other end of the gas supply line 19. The gas supply system 20 includes mass flow controllers (MFC) 21 for controlling a gas flow rate; a processing gas supply source 22 for supplying, e.g., a processing gas for etching and the like; an Ar gas source 23 for supplying an Ar gas; and so forth.

In the meantime, an annular magnetic field forming mechanism (a ring magnet) 24 is disposed around the peripheral portion of the vacuum chamber 1, concentrically with the vacuum chamber 1, so that a magnetic field can be formed in a processing space between the mounting table 2 and the shower head 15. The entire magnetic field forming mechanism 24 can rotate around the vacuum chamber 1 at a predetermined angular speed by a rotation mechanism 25.

Further, plasma processing mechanisms for performing a plasma process on the semiconductor wafer W, e.g., the DC power supply 5, the high frequency power supply 11 and the gas supply system 20, are controlled by a controller 40.

Hereinafter, there will be described a sequence of an etching process performed by the above-mentioned etching apparatus.

First Preferred Embodiment

First, a gate valve (not shown) installed in the vacuum chamber 1 is opened, and the semiconductor wafer W is loaded into the vacuum chamber 1 by a transfer mechanism (not shown) through a load lock chamber (not shown) disposed in proximity to the gate valve to be mounted on the mounting table 2. Then, the transfer mechanism is withdrawn from the vacuum chamber 1 and the gate valve is closed. At this point, a DC voltage (HV) is not applied to the electrostatic chuck electrode 4a of the electrostatic chuck 4 from the DC power supply 5.

Figure 2:
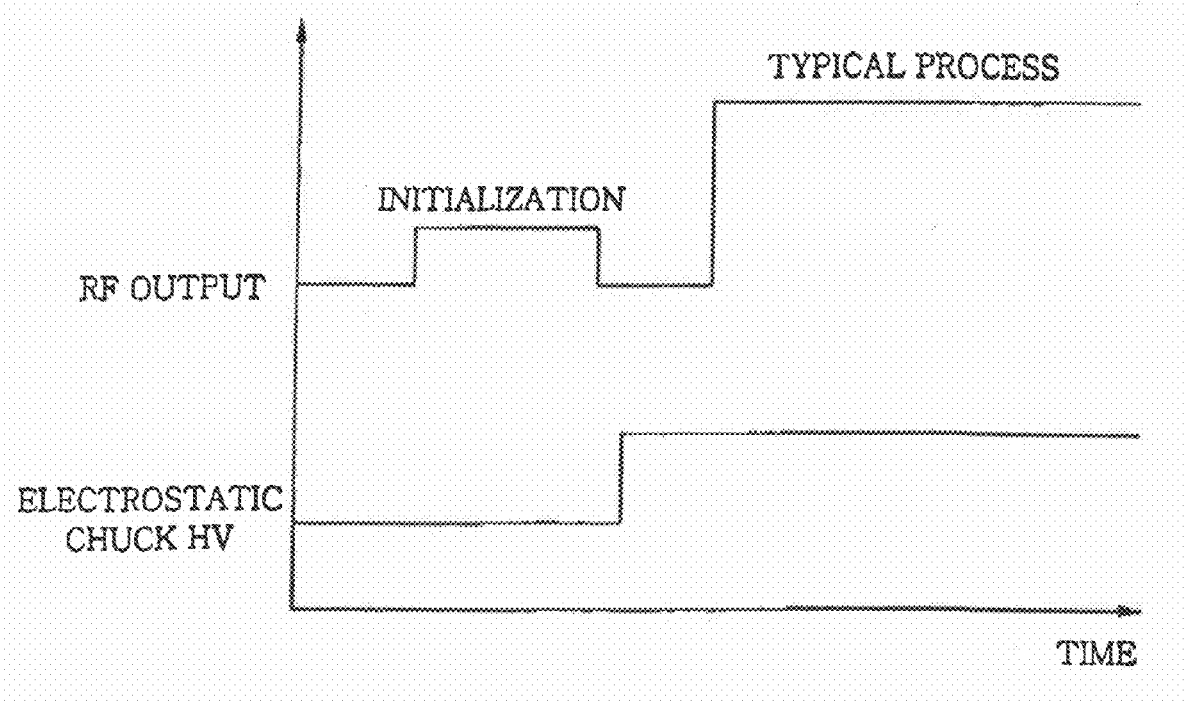
FIG. 2 illustrates a diagram for explaining a plasma processing method in accordance with the embodiment of the present invention.

Thereafter, while the vacuum chamber 1 is exhausted to a predetermined vacuum level through the gas exhaust port 13 by the vacuum pump of the gas exhaust unit 14, the Ar gas is supplied into the vacuum chamber 1 from the Ar gas supply source 23. Under this condition, as shown in FIG. 2, a high frequency power of a relatively small level (of, e.g., 13.56 MHz) such as 300 W is supplied to the mounting table 2 also serving as a lower electrode from the high frequency power supply 11 to thereby generate a weak plasma which acts on the semiconductor wafer W.

The reasons for making such the weak plasma act on the semiconductor wafer W are as follows.

There is a case where a state of the semiconductor wafer W in process is not consistent due to an influence of a previous process (e.g., a CVD film forming process) and, for example, charges are accumulated in the semiconductor wafer W. When a strong plasma acts on the semiconductor wafer W in the state where the charges are accumulated in the semiconductor wafer W, there is a high possibility that the surface arcing or the like occurs. Therefore, the weak plasma is made to act on the wafer before the strong plasma is applied thereto, in order to adjust (initialize), e.g., a state of the charges accumulated in the wafer W to be consistent.

Further, when adjusting the state of charges accumulated in the semiconductor wafer W, the semiconductor wafer is adjusted (initialized) by using the weak plasma without the DC voltage (HV) applied to the electrostatic chuck electrode 4a of the electrostatic chuck 4 in order to facilitate movement of the charges in the semiconductor wafer W.

Furthermore, a high frequency power applied to generate the weak plasma is about $0.15 \text{ W/cm}^2 \sim 1.0 \text{ W/cm}^2$, e.g., about 100~500 W, and time during which the weak plasma acts on the semiconductor wafer W is, e.g., about 5~20 seconds.

The embodiment has been described by using a case employing the Ar gas and the Ar gas plasma, but the gas need not be limited thereto and $O_2$ gas, $CF_4$ gas, $N_2$ gas and the like may be used. However, in selecting a gas, care must be given such that the gas plasma generated should not have any undesired reaction, e.g., etching, on the semiconductor wafer W and an inner wall of the vacuum chamber 1 and should be easily ignited. Further, the selection of a most suitable gas can depend on what kind of process has been performed on the semiconductor wafer W in a previous process and it is preferable that such a fact should be taken into consideration in selecting the most suitable gas.

After the weak plasma acts on the semiconductor wafer W as described above, as shown in FIG. 2, a DC voltage (HV) is applied to the electrostatic chuck electrode 4a from the DC power supply 5. Then, a specified processing gas (an etching gas) is supplied into the vacuum chamber 1 from the processing gas supply source 22, and a high frequency power of a large level (of, e.g., 13.56 MHz) for a typical process, such as 2000 W, is supplied to the mounting table 2 serving as the lower electrode from the high frequency power supply 11 to thereby generate the strong plasma and perform a typical plasma process (an etching process). Further, in FIG. 2, a horizontal axis represents time and a vertical axis represents a voltage value in case of electrostatic chuck HV and a power value in case of RF output.

At this point, a high frequency power is applied to the mounting table 2 serving as the lower electrode, whereby a high frequency electric field is formed in the processing space between the shower head 15 serving as the upper electrode and the mounting table 2 serving as the lower electrode and a magnetic field is also formed therein by the magnetic field forming mechanism 24. Under this condition, a plasma etching is carried out.

Once the etching process is performed, the high frequency power is stopped from being supplied from the high frequency power supply 11 to stop the etching process. Then, the semiconductor wafer W is unloaded from the vacuum chamber 1 in a reverse order of the above-described sequence.

As described above, when the etching process is performed on the semiconductor wafer W after the weak plasma acts on the semiconductor wafer W, a rate of the surface arcing generated on the semiconductor wafer W can be reduced to approximately zero (equal to or less than 1%) regardless of a lot. On the other hand, when the process is started without the aforementioned weak plasma's action, the rate of the surface arcing generated on the semiconductor wafer W may be about 80% depending on the lot. It is attributed to the semiconductor wafer W charged with electricity in a previous process performed before etching. Especially, in case that the previous process is one to form a so-called Low-K film by CVD, the surface arcing is highly likely to be generated.

Therefore, it can be confirmed that, as described above, by making the weak plasma act on the semiconductor wafer W before starting a typical process, the rate of the surface arcing generated on the semiconductor wafer W can be reduced sharply.

Figure 3:
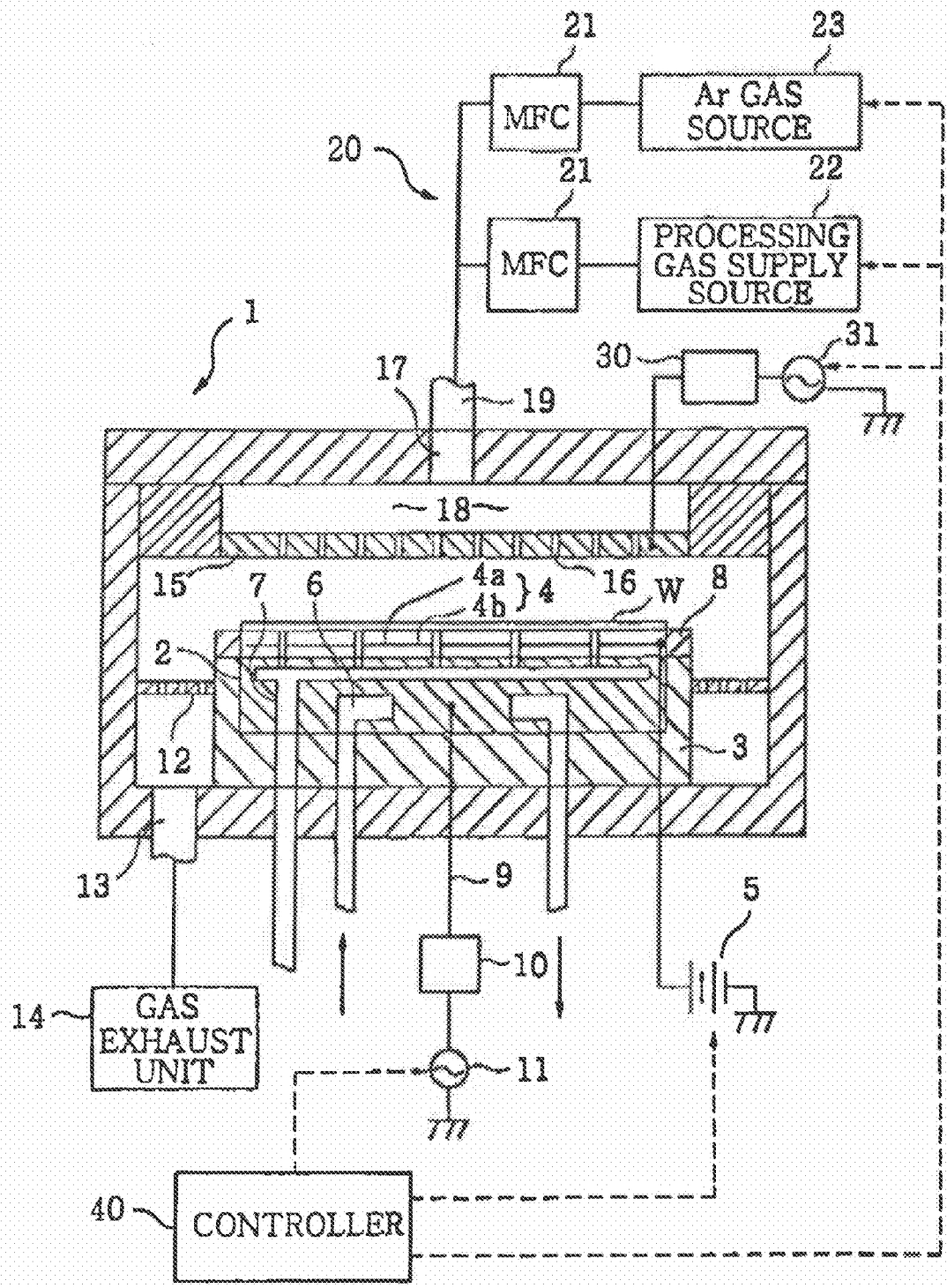
FIG. 3 describes a schematic configuration of an apparatus for use in another embodiment of the present invention.

Although the first embodiment has been described by using the apparatus shown in FIG. 1, wherein the high frequency power is applied only to the mounting table 2 serving as the lower electrode, the present invention may be applied to, for example, a so-called electrical power applied upper and lower electrode plasma processing apparatus, wherein the high frequency power is also applied to the shower head 15 serving as the upper electrode via the matching unit 30 from the high frequency power supply 31, as shown in FIG. 3.

Figure 4:
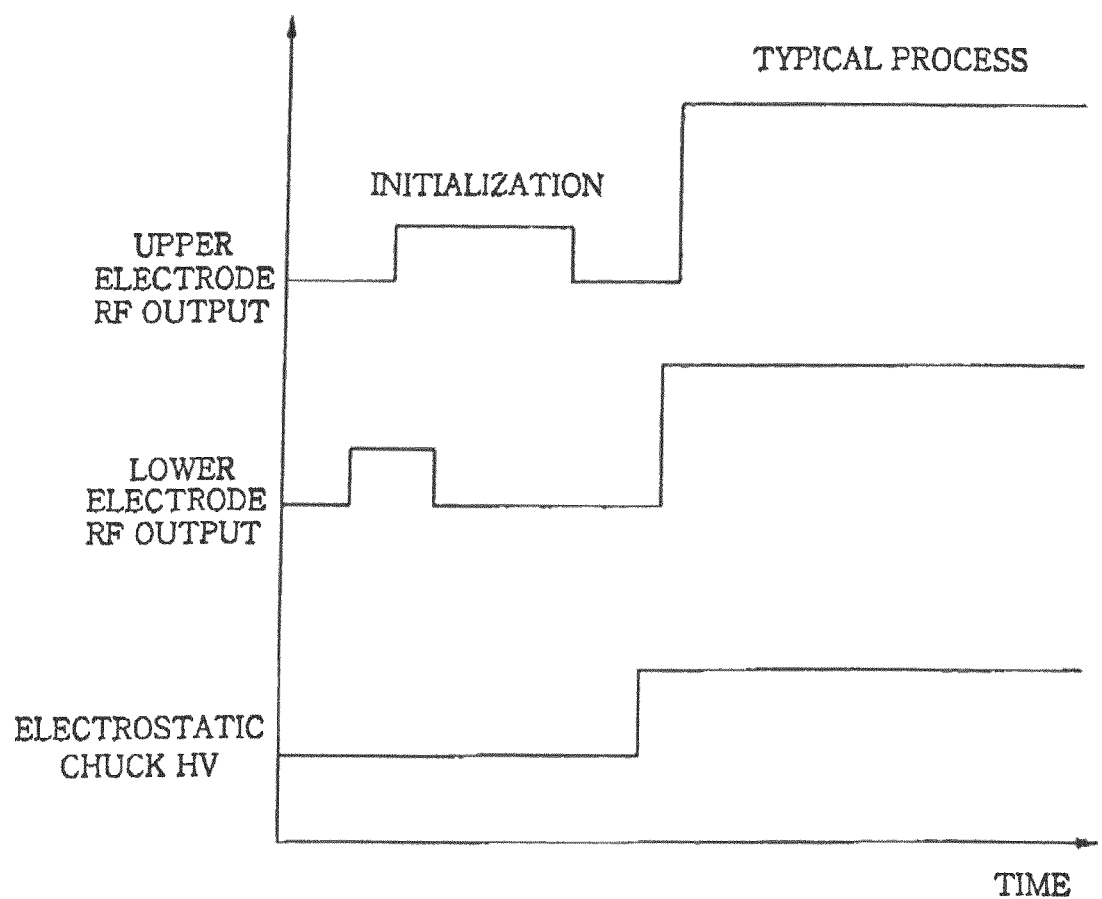
FIG. 4 offers a diagram for explaining a plasma processing method in accordance with the embodiment of the present invention shown in FIG. 3.

In this case, for example, first, a high frequency power of a small level is applied to the mounting table 2 serving as the lower electrode as shown in FIG. 4. Then, a high frequency power of a small level is applied to the shower head 15 serving as the upper electrode, and the high frequency power is stopped from being applied to the mounting table 2 serving as the lower electrode. In this state, after the weak plasma is made to act on the semiconductor wafer W for a predetermined period, the high frequency power is also stopped from being applied to the shower head 15 serving as the upper electrode to extinguish the plasma.

Thereafter, by performing sequential steps of applying a DC voltage (HV) to the electrostatic chuck electrode 4a of the electrostatic chuck 4; applying a high frequency power used for a typical process (a high frequency power of a large level) to the mounting table 2 serving as the lower electrode; and applying a high frequency power used for a typical process (a high frequency power of a large level) to the shower head 15 serving as the upper electrode, a typical process is carried out on the semiconductor wafer W.

As described above, the present invention can be applied to the electrical power applied upper and lower electrode plasma processing apparatus.

Further, it is also preferable that an ionizer is operated on the semiconductor wafer W before starting a process in addition to or independently of the above-mentioned action of the weak plasma so that charges therein can be reduced, thereby preventing the surface arcing from occurring. The ionizer may be installed inside or outside the chamber.

Figure 5:
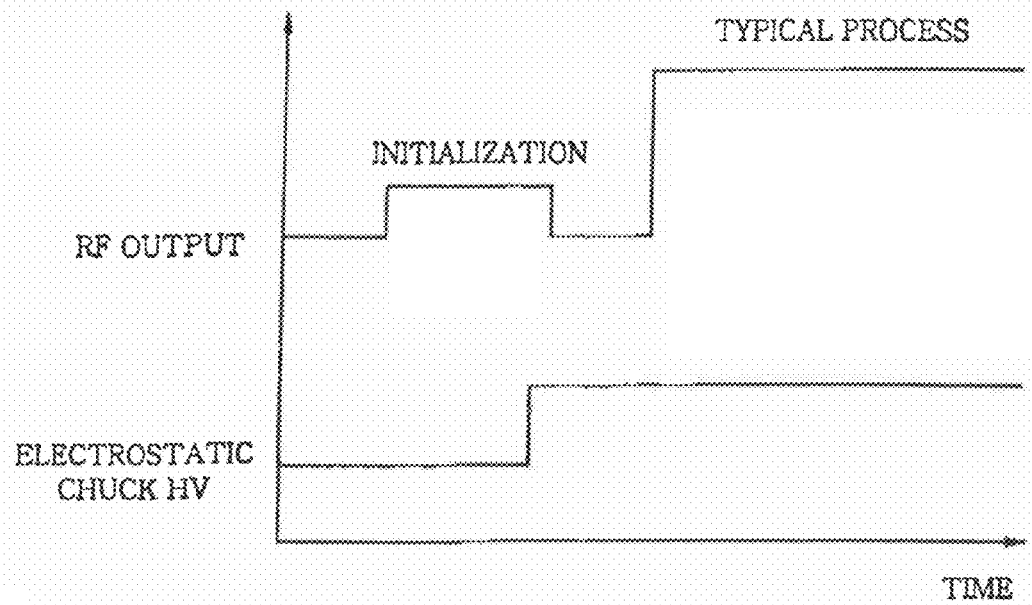
FIG. 5 provides a diagram for explaining a plasma processing method in accordance with a modification of the embodiment shown in FIG. 2.

However, in the plasma processing method shown in FIG. 2, after the weak plasma is generated by applying the high frequency power of a small level to the mounting table 2 serving as the lower electrode, in a state where there is no applied high frequency power, the DC voltage (HV) is applied to the electrostatic chuck electrode 4a of the electrostatic chuck 4. As described above, when starting applying the DC voltage (HV) to the electrostatic chuck electrode 4a of the electrostatic chuck 4 in a state where there is no applied high frequency power after the weak plasma is generated by applying the small high frequency power to the mounting table 2 serving as the lower electrode, it is possible to damage the substrate due to a thunder-like discharge generated at a time of starting applying the DC voltage (HV). Accordingly, as shown in FIG. 5, the DC voltage (HV) is applied to the electrostatic chuck electrode 4a of the electrostatic chuck 4 in a state where a high frequency power is applied to the mounting table 2 (in a state where the weak plasma is generated) to thereby suppress generation of the discharge.

In the first embodiment, there has been described the method for generating the weak plasma by using the Ar gas before the plasma process such as etching, and ON/OFF timing of the DC voltage applied to the electrostatic chuck electrode 4a at that time.

Second Preferred Embodiment

Hereinafter, there will be described a preferred embodiment in relation to ON/OFF timing of the high frequency power and ON/OFF timing of the DC voltage applied to the electrostatic chuck electrode 4a when performing the plasma process such as etching.

As for the electrostatic chuck 4, there are a bipolar type and a unipolar type, each type including one using Coulomb effect and one using Johnson-Rahbek effect. In case of employing the electrostatic chuck 4 of a unipolar type using Coulomb effect, it is preferable to attract and hold the semiconductor wafer W by following a sequence shown in FIG. 6, wherein a horizontal axis represents time; and a vertical axis represents an applied high frequency power value (W) depicted by a dotted line and an applied DC voltage value (V) depicted by a solid line.

That is, after mounting the semiconductor wafer W on the mounting table 2 (the electrostatic chuck 4), a gas is introduced into the vacuum chamber 1. Then, as depicted by the dotted line in FIG. 6, the high frequency power is applied to the mounting table 2 to generate a plasma and, then, the DC voltage (HV) is applied to the electrostatic chuck electrode 4a as depicted by the solid line in FIG. 6.

Further, since the semiconductor wafer W is not attracted to the electrostatic chuck 4 before the DC voltage (HV) being applied to the electrostatic chuck electrode 4a, a temperature control thereof is not sufficiently performed. Consequently, a high frequency power of a relatively small level (e.g., about 500 W) compared to one being applied when performing a process is preferably applied to the mounting table 2 as a high frequency power for generating a plasma at the beginning such that a temperature of the semiconductor wafer W is not increased by the action of the plasma.

Figure 6:
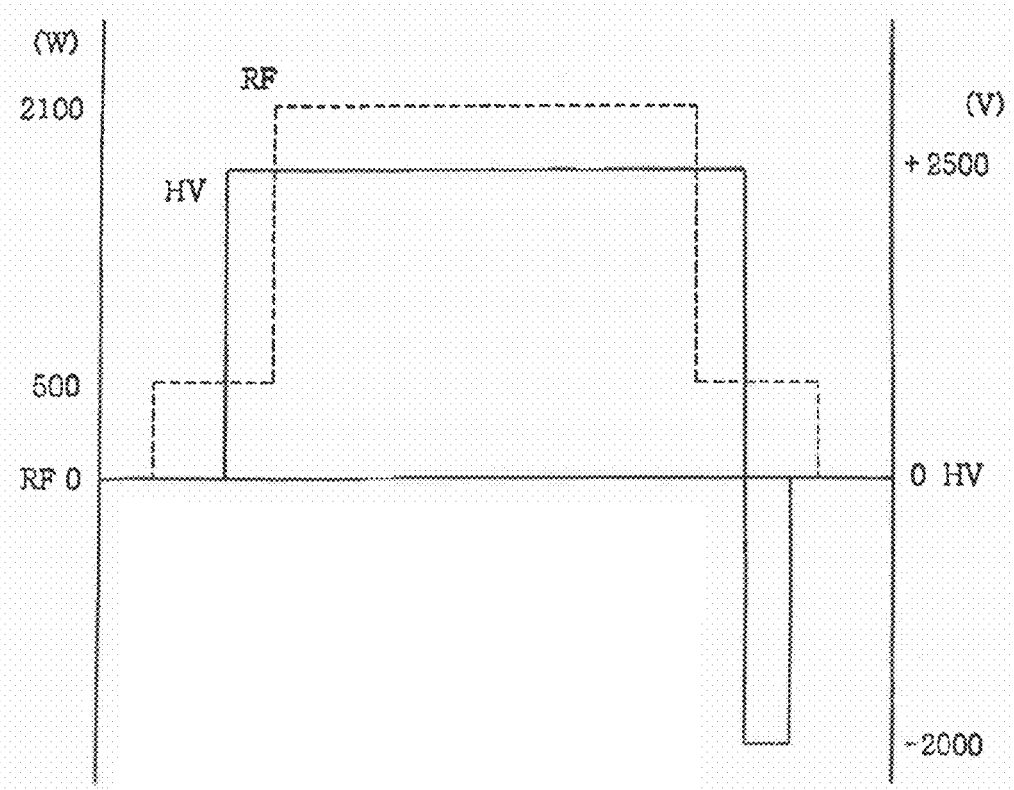
FIG. 6 presents a diagram for explaining a chucking method using an electrostatic chuck.

Also, even when the semiconductor wafer W is detached from the electrostatic chuck 4, after completing the plasma process, the applied high frequency power value is decreased to have a relatively small value (not 0 W) compared to one being applied when performing a process as shown in FIG. 6. After stopping applying the DC voltage (HV) to the electrostatic chuck electrode 4a, the high frequency power is stopped from being applied to extinguish the plasma. When stopping applying the DC voltage (HV) to the electrostatic chuck electrode 4a, an opposite voltage (e.g., about −2000 V) to an attraction voltage may be applied to the electrostatic chuck electrode 4a for a time to remove the charges to thereby make it easy to detach the semiconductor wafer W. Such an opposite voltage is applied when it is necessary. That is, if the semiconductor wafer W is easily detachable from the electrostatic chuck 4 without applying the opposite voltage, the opposite voltage is not applied.

FIG. 7 depicts a diagram for explaining potential variation in an electrode (Cu) made of copper and an insulating film (PI) made of polyimide in the electrostatic chuck (ESC); a backside surface oxide film (B.S. Ox), a silicon substrate (Si Sub) and an oxide film (Ox) of a multi layer wafer; a processing space (Space) in the vacuum chamber; and an upper electrode (Wall) when a sequence of attracting the semiconductor wafer W is carried out.

As shown in FIG. 7, when the semiconductor wafer W is mounted on the mounting table 2 by moving down a wafer supporting pin disposed in the mounting table 2, potential values of respective portions are zero (see ① in FIG. 7). Then, also when a gas is introduced into the vacuum chamber 1, potential values of respective portions are zero (see ② in FIG. 7).

After that, when a high frequency power is applied to generate a plasma, a potential value of the semiconductor wafer becomes minus a few hundred V, which is determined based on a plasma state (see ③ in FIG. 7).

In this state, when a DC voltage (HV) begins to be applied to the electrostatic chuck electrode 4a, the potential of the electrostatic chuck electrode 4a becomes the potential (e.g., about 1.5 KV) of the applied DC voltage (HV) and a potential difference is generated in the insulating film (PI) to thereby attract the semiconductor wafer W (see ④ in FIG. 7).

When the above-mentioned sequence of attracting the semiconductor wafer W by using the electrostatic chuck 4 being followed, a high voltage caused by the DC voltage (HV) applied to the electrostatic chuck electrode 4a is not applied to the surface of the semiconductor wafer W, an undesired abnormal discharge can be prevented from occurring on the surface of the semiconductor wafer W.

Figure 9:
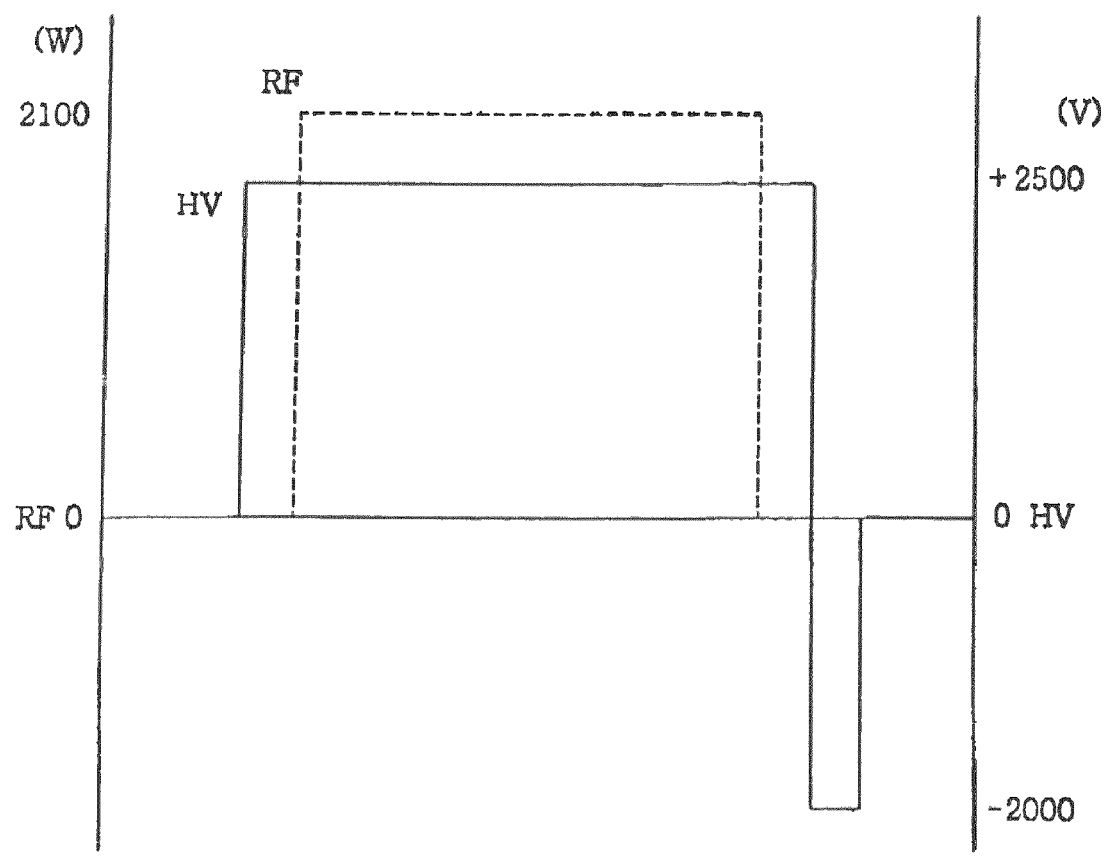
FIG. 9 sets forth a diagram for explaining a comparison of the chucking method using the electrostatic chuck.

Further, the sequence described in the second embodiment, wherein the DC voltage is applied in a state where the high frequency power is applied, exhibits the following effects, compared to a sequence shown in FIG. 9.

Figure 10:
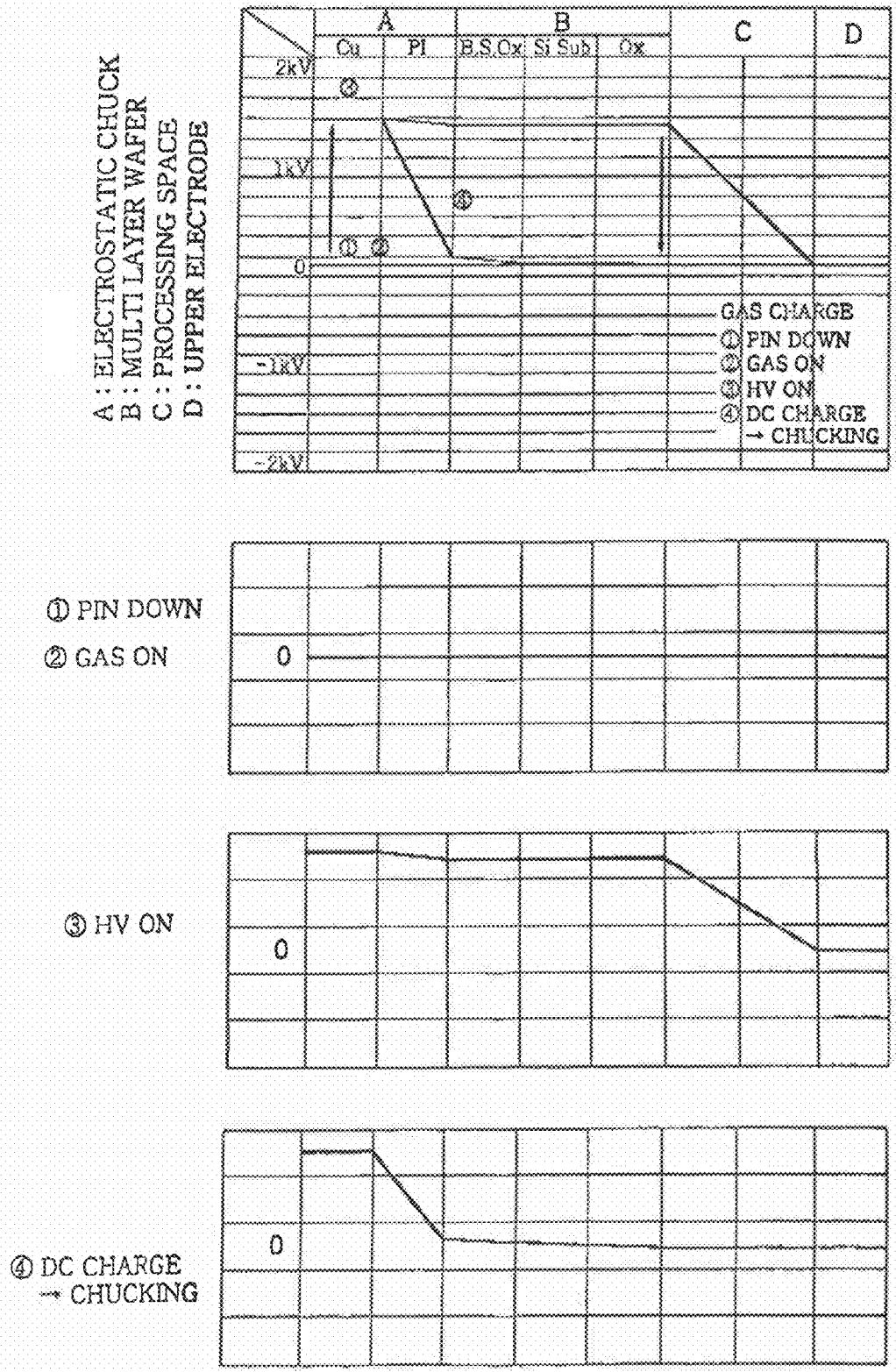
FIG. 10 illustrates a diagram for explaining potential variation of each portion in the chucking method shown in FIG. 9.

In accordance with a sequence shown in FIG. 9, wherein at the beginning of the plasma process, the high frequency power is applied to the lower electrode (or the upper electrode) after the DC voltage is applied to the electrostatic chuck electrode 4a, and after completing the plasma process, the DC voltage is turned off after the high frequency power is turned off, when the semiconductor wafer W is attracted or detached, a large voltage is applied to the semiconductor wafer W as shown in FIG. 10. Consequently, the surface of the semiconductor wafer W may be damaged and, specifically, surface defects having a diameter of about several tens of μm may be made. The surface defects can cause an arcing during etching depending on places of their origin to thereby produce inferior goods. Further, the surface defects become particles, which may adhere to the surface of the semiconductor wafer W.

However, by following the sequence described in the present embodiment, wherein the DC voltage is applied after the high frequency power is applied at the beginning of the process and the high frequency power is turned off after the DC Voltage is turned off in completion of the process, a high voltage is prevented from being applied to the semiconductor wafer W. Consequently, the semiconductor wafer W is not damaged and, at the same time, particles can be prevented from being generated on the surface of the semiconductor wafer W.

Further, even though the surface of the semiconductor wafer W is not damaged when the sequence shown in FIG. 9 is followed, the semiconductor wafer W is charged by applying the DC voltage to the electrostatic chuck electrode 4a, whereby particles floating usually in the processing chamber can be adhered to the semiconductor wafer W by an electrostatic force.

On the other hand, when following the sequence, wherein the DC voltage is applied after the high frequency power is applied at the beginning of the process and the high frequency power is turned off after the DC voltage is turned off in completion of the process, a high frequency discharge is kept before applying the DC voltage to the electrostatic chuck, whereby floating charged particles are trapped in an ion sheath and, as a result, there is an additional effect that particles adhered to the surface of the semiconductor wafer W can be reduced.

Hereinafter, there will be described results of measuring the number of particles trapped in the ion sheath.

FIG. 11 represents a result of examining the number of particles corresponding to a DC voltage applied to the electrostatic chuck for attracting the semiconductor wafer W.

In other words, CF-based reaction product serving as a particle generator is adhered to an inner portion of the processing chamber of the plasma processing apparatus (seasoning) and, then, the semiconductor wafer W is loaded into the processing chamber and mounted on the electrostatic chuck while flowing the processing gas for a predetermined time period. Thereafter, the semiconductor wafer W is charge-neutralized and unloaded from the processing chamber. The number of the particles adhered to the semiconductor wafer W is counted for three categories of particle sizes when DC voltages applied to the electrostatic chuck are, respectively, 0 V, 1.5 kV, 2.0 kV and 2.5 kV.

As shown in FIG. 11, when the DC voltage applied to the electrostatic chuck is high, the number of the particles adhered to the semiconductor wafer W becomes increased. That is, it is known that application of the DC voltage to the electrostatic chuck affects adhesion of the particles to the semiconductor wafer W.

Further, the above-mentioned seasoning step is performed under the following conditions:
pressure: 6.65 Pa
high frequency power: 3500 W
used gases: $C_4F_8/Ar/CH_2F_2$=13/600/5 sccm
pressures on the backside surface of the wafer (center/periphery): 1330/3990 Pa
temperatures (ceiling/sidewall/bottom): 60/60/60° C.
time for applying high frequency power: 3 minutes.

Furthermore, when mounting the semiconductor wafer W on the electrostatic chuck and flowing the gases, conditions of a pressure, used gases, a pressure on the backside surface of the wafer and a temperature are same as above, but a high frequency power is zero and time for flowing gases is 60 seconds.

Moreover, as for the charge neutralization, the semiconductor wafer W is charge-neutralized under conditions:
pressure: 26.6 Pa
applied power: −1.5 kV
time for applying power: 1 second
pressure: 53.2 Pa
$N_2$: 1000 sccm
time: 15 seconds,
and the electrostatic chuck is charge-neutralized under conditions:
applied voltage: −2.0 kV
time for applying power: 1 second.

The charge neutralization is performed to prevent the semiconductor wafer W from jumping out when transferring the semiconductor wafer W after completing the process since jump-out of the semiconductor wafer W may cause readhesion of unnecessary particles.

Further, after the seasoning step, the semiconductor wafer W is loaded into the processing chamber and $O_2$ dry cleaning is performed to generate a number of particles from a reaction product adhered in the seasoning step. At this time, the number of particles adhered to the semiconductor wafer W is measured in a sequence of, wherein the DC voltage is applied after the high frequency power is applied at the beginning of the process and the high frequency power is turned off after the DC voltage is turned off in completion of the process, and a sequence of, wherein the high frequency power is applied after the DC voltage is applied at the beginning of the process and the DC voltage is turned off after the high frequency power is turned off in completion of the process, respectively. FIG. 12 presents the result thereof. Furthermore, in this case, seasoning and charge neutralization are carried out as described above, and $O_2$ dry cleaning is performed under conditions:
pressure: 13.3 Pa
high frequency power: 1000 W
used gas: $O_2$=1000 sccm
pressures on the backside surface of the wafer (center/periphery): 1330/3990 Pa
temperatures (ceiling/sidewall/bottom): 60/60/60° C.
time for applying high frequency power: 30 seconds.

As shown in FIG. 12, when employing the sequence of, wherein the DC voltage is applied after the high frequency power is applied at the beginning of the process and the high frequency power is turned off after the DC voltage is turned off in completion of the process, the number of adhered particles can be reduced sharply.

Additionally, even for a sequence as shown in FIG. 8, wherein, while the semiconductor wafer W is supported by a wafer supporting pin (supporting rod) disposed in the mounting table 2 (①), a DC voltage (HV) begins to be applied to the electrostatic chuck electrode 4a (②) and then, the wafer supporting pin is moved down, so that the semiconductor wafer W is mounted on the mounting table 2 (③, ④) to thereby attract the semiconductor wafer W, the surface of the semiconductor wafer W does not have potential of the applied DC voltage (HV). Accordingly, by following such a sequence, an undesired abnormal discharge can be prevented from occurring on the surface of the semiconductor wafer W. However, the above sequence can be performed only when the wafer supporting pin is conductive and charges are supplied to the semiconductor wafer W from the pin.

In addition, the above-mentioned abnormal discharge generated in attraction due to the electrostatic chuck can be prevented by using a bipolar electrostatic chuck, even though it is the same Coulomb type electrostatic chuck.

Further, although the etching process using a parallel plate etching apparatus is described in the above embodiments, the present invention can be applied to all plasma processing apparatuses without being limited thereto. Furthermore, although the weak plasma acts in the vacuum chamber of the etching apparatus where the etching process is performed in the above embodiments, the weak plasma can act in a separate place serving as a processing apparatus and the semiconductor wafer W can be initialized.

As described in detail above, in accordance with the present invention, a surface arcing can be prevented from occurring on a substrate to be processed to thereby improve productivity compared to conventional ones.

While the invention has been shown and described with respect to the preferred embodiments, it will be understood by those skilled in the art that various changes and modifications may be without departing from the spirit and scope of the invention as defined in the following claims.

What is claimed is:

1. A plasma processing method, comprising the following sequential steps of:

applying a first high frequency power of a first power level to a lower electrode for mounting thereon a substrate to be processed;

applying a second high frequency power of a second power level to an upper electrode disposed to face the lower electrode to thereby make a first plasma;

applying a DC voltage to an electrostatic chuck for attracting and holding the substrate;

applying a third high frequency power of a third power level to the lower electrode; and performing a plasma process on the substrate by applying a fourth high frequency power of a fourth power level to the upper electrode to make a second plasma, wherein the third and the fourth power level are greater than the first and the second power level, respectively, and the first plasma is weaker than the second plasma.

2. The plasma processing method of claim 1, further comprising, between the steps of applying the second high frequency power and applying the DC voltage, the steps of:

stopping applying the first high frequency power to the lower electrode; and stopping applying the second high frequency power to the upper electrode.

3. The plasma processing method of claim 1, wherein the first plasma is formed by using Ar gas, $O_2$ gas, $CF_4$ gas or $N_2$ gas.

4. The plasma processing method of claim 1, wherein the first plasma is formed by using the first and the second power level of 0.15~1.0 $W/cm^2$.

5. The plasma processing method of claim 1, wherein the first plasma acts on the substrate for 5~20 seconds.

* * * * *